United States Patent [19]
Ishibashi et al.

[11] Patent Number: 5,898,662
[45] Date of Patent: Apr. 27, 1999

[54] SEMICONDUCTOR LIGHT EMITTING DEVICE, ITS MANUFACTURING METHOD AND OPTICAL RECORDING AND/OR REPRODUCING APPARATUS

[75] Inventors: Akira Ishibashi; Satoshi Taniguchi; Tomonori Hino; Takashi Kobayashi, all of Kanagawa; Kazushi Nakano, Tokyo; Norikazu Nakayama, Kanagawa, all of Japan

[73] Assignee: Sony Corporation, Tokyo, Japan

[21] Appl. No.: 08/967,095

[22] Filed: Nov. 10, 1997

[30] Foreign Application Priority Data

Nov. 11, 1996 [JP] Japan .................................. 8-336208

[51] Int. Cl.⁶ ........................................................ H01S 3/18
[52] U.S. Cl. .......................... 369/121; 369/122; 372/43; 372/45; 438/43; 438/44; 438/45
[58] Field of Search .................................... 369/121, 122; 372/45, 43; 438/45, 46, 938, 603, 43, 44

[56] References Cited

U.S. PATENT DOCUMENTS

| | | | |
|---|---|---|---|
| 5,657,336 | 8/1997 | Okuyama et al. | 372/45 |
| 5,764,672 | 6/1998 | Ukita et al. | 372/45 |
| 5,766,345 | 6/1998 | Tomita et al. | 117/105 |
| 5,780,322 | 7/1998 | Tamamura et al. | 438/45 |

*Primary Examiner*—Tod R. Swann
*Assistant Examiner*—Kim-Kwok Chu
*Attorney, Agent, or Firm*—Hill & Simpson

[57] ABSTRACT

A semiconductor light emitting device comprises: a compound semiconductor substrate; an n-type cladding layer on the compound semiconductor substrate; an active layer on the n-type cladding layer; a p-type cladding layer on the active layer: and a p-type contact layer on the p-type cladding layer, the n-type cladding layer, the active layer, the p-type cladding layer and the p-type contact layer being made of II–VI compound semiconductors containing at least one of group II elements selected from the group consisting of Zn, Cd, Mg, Hg and Be and at least one of group VI elements selected from the group consisting of S, Se, Te and O, characterized in that at least the active layer has undulations and at least the p-type layer is flat. A method for manufacturing a semiconductor light emitting device having: a compound semiconductor substrate; an n-type cladding layer on the compound semiconductor substrate; an active layer on the n-type cladding layer; and a p-type cladding layer on the active layer, the n-type cladding layer, the active layer and the p-type cladding layer being made of II–VI compound semiconductors containing at least one of group II elements selected from the group consisting of Zn, Cd, Mg, Hg and Be and at least one of group VI elements selected from the group consisting of S, Se, Te and O, characterized in that the n-type cladding layer, the active layer and said p-type cladding layer are grown by varying, for the respective layers, the ratio of the molecular beam intensity of the group VI element relative to the molecular beam intensity of the group II element.

14 Claims, 10 Drawing Sheets

SEMICONDUCTOR LIGHT EMITTING DEVICE, ITS MANUFACTURING METHOD AND OPTICAL RECORDING AND/OR REPRODUCING APPARATUS

BACKGROUND OF THE INVENTION

1. Field of the Invention

This invention relates to a semiconductor light emitting device, its manufacturing method, and an optical recording and/or reproducing apparatus. More particularly, the invention relates to a semiconductor light emitting device using II–VI compound semiconductors, and a manufacturing method thereof, and an optical recording and/or reproducing apparatus using the semiconductor light emitting device as its light emitting device.

2. Description of the Related Art

For purposes of realizing higher densities and higher resolutions of optical discs and magneto-optical discs, there is a progressively strong demand for semiconductor light emitting devices such as semiconductor lasers, light emitting diodes, etc. for emitting blue to green light, and studies are being made for realization of such devices.

Most hopeful materials for manufacturing semiconductor light emitting devices for emitting blue to green light are II–VI compound semiconductors using group II elements, such as Zn, Cd, Mg, Hg and Be, and group VI elements, such as S, Se, Te and O. Especially, a quaternary mixed crystal, ZnMgSSe, is known as a material which can be crystallographically grown on a GaAs substrate excellent in crystalline property and readily available and is therefore suitable for forming cladding layers, optical guide layers upon manufacturing semiconductor lasers for emission of blue light, for example, using the GaAs substrate (for example, Electronics Letters 28(1992) p.1798).

A typical conventional method for manufacturing semiconductor light emitting devices using II–VI compound semiconductors, in particular, semiconductor light emitting devices using ZnMgSSe layers as cladding layers, was to sequentially grow an n-type MgSSe cladding layer, active layer, p-type ZnMGSSe cladding layer, active layer, p-type ZnMgSSe cladding layer, p-type ZnSe contact layer on an n-type GaAs substrate via a buffer layer by molecular beam epitaxy (MBE), thereafter form a p-side electrode on the p-type ZnSe contact layer, and form an n-side electrode on the bottom surface of the n-type GaAs substrate. In these semiconductor light emitting devices, however, it was difficult to bring the p-side electrode into ohmic contact with the p-type ZnSe contact layer because of a difficulty in increasing the carrier concentration of the p-type ZnSe contact layer.

To overcome the problem, another technology was proposed, which grows a p-type ZnSe/ZnTe multiquantum well(MQW) layer on a p-type ZnSe contact layer, additionally grows thereon a p-type ZnTe contact layer readily made with a high carrier concentration, and further grows thereon a p-side electrode, in particular, a Pd/Pt/Au p-side electrode, so as to improve the ohmic contact characteristics. Actually, continuous oscillation at a room temperature has been realized with a semiconductor laser which employs the above-mentioned contact structure of the p-side electrode in a ZnSe/ZnSSe/ZnMgSSe SCH structure (Separate Confinement Heterostructure) using a ZnCdSe layer as the active layer, ZnSSe layer as the optical guide layer, ZnMgSSe layer as the cladding layer (for example, JPN. J. Appl. Phys. 33(1994) p.L938).

OBJECTS AND SUMMARY OF THE INVENTION

However, it has been known to the Inventor that the conventional semiconductor light emitting device using the above-explained contact structure of the p-side electrode suffers progressive deterioration in the contact structure of the p-side electrode while electrically supplied, until it is finally broken. Also, it has been found that such breakage by progressive deterioration occurs also in the active layer. Due to the deterioration in the active layer, the lifetime of the device under a room temperature does not extend beyond a certain limit as compared to the lifetime of the device under high temperatures. For these reasons, semiconductor light emitting devices heretofore available are dissatisfactory in characteristics and reliability, and are short in lifetime.

It is therefore an object of the invention to provide a semiconductor light emitting device with good characteristics, high reliability and long lifetime, its manufacturing method, and an optical recording and/or reproducing apparatus using the semiconductor light emitting device as its light emitting device.

The Inventors have made studies with all efforts to overcome the problems involved in conventional techniques. Explained below is an outline of the studies.

FIG. 1 shows results of measurement, through an atomic force microscope (AFM), of standard deviation (RMS (Root Mean Square)) in height of periodic undulations appearing on layer surfaces (typically extending in the <1–10> direction) when a semiconductor light emitting device using II–VI compound semiconductors is fabricated by growing a cladding layer, optical guide layer, active layer, p-type contact layer, and so on, by MBE while changing ratios of molecular beam intensities of group VI elements relative to molecular beam intensities of group II elements (VI/II ratios). If these layers are expressed as ZnCdMgHgBeSSeTeO layers, then a VI/II ratio is defined as follows:

$$\text{VI/II ratio} = (fSe + 0.3 \times fZnS + fO + fTe)/(fZn + fCd + fMg + fHg + fBe + fZnS)$$

where fx is the intensity of the molecular beam intensity of a source material x (supplied amount of x).

From FIG. 1, when the VI/II ratio is not smaller than 0.6 and not larger than 1.0, especially not smaller than 0.6 and not larger than 0.9, RMS of undulation heights is 1 to 3 nm. According to the knowledge of the Inventors, the lifetime of the active layer is maximized when it is grown under conditions producing these undulations. It is presumed that these undulations suppress multiplication of crystal defects. On the other hand, when the VI/II ratio is not smaller than 1.0 and not larger than 1.2, RMS is 1 nm or less, and it is known that the surface is substantially flat. According to the knowledge of the Inventors, the lifetime of the p-side electrode can be maximized by growing the p-type contact layer for contact with the p-side electrode under conditions producing such a flat surface.

The Inventors have found that, as shown in FIG. 2, a semiconductor light emitting device using II–VI compound semiconductors exhibits two modes of deterioration, namely, the mode of deterioration by $E_a = 1.1$ eV and the mode of deterioration by $E_a = 0.3$ eV when the activation energy is $E_a$, due to the lifetime of the device being dependent upon temperatures (T). Therefore, suppression of these modes of deterioration leads to an improvement of the lifetime of the device.

Also, the Inventors investigated the modes of deterioration relative to conditions of VI/II ratios of respective layers, such as cladding layer, optical guide layer, active layer, and so forth, and have found that various modes of deterioration with those activation energies occur depending upon conditions of VI/II ratios of respective layers. For example, FIGS. 3 and 4 show relations between ambient temperatures where the mode of deterioration by $E_a=0.3$ eV appears (hereinafter referred to as change temperatures) and VI/II ratios of p-type cladding layers and p-type or n-type optical guide layers, using samples expected through a high-temperature acceleration test to have $E_a=1.1$ eV and to be equivalent in lifetime. FIG. 5 shows how the crossing point (change temperature) of both modes of deterioration is shifted when there are changes in position where the mode of deterioration governing the device lifetime with $E_a=0.3$ eV appears whilst the device lifetime governed by the mode of deterioration by $E_a=1.1$ eV is constant. It is known from FIG. 5 that the change temperature becomes lower as the mode of deterioration by $E_a=0.3$ eV becomes unlikely to govern the device lifetime. It is known from FIGS. 3 and 4 that the mode of deterioration by $E_a=0.3$ eV appears from a temperature range and dominates the device deterioration when VI/II ratios of p-type cladding layers and optical guide layers decrease, and, in contrast, the mode of deterioration by $E_a=0.3$ eV is unlikely to dominate the device deterioration when the VI/II ratios are high. It is known, therefore, that domination of the mode of deterioration by $E_a=0.3$ eV to the device deterioration can be limited to temperatures not higher than room temperatures by setting the VI/II ratio of the p-type cladding layer to 0.9 or more.

Additionally, it is possible to suppress the mode of deterioration by $E_a=0.3$ eV and to overcome the limit of the device lifetime at room temperatures.

As to the active layer, it has been found that the mode of deterioration by $E_a=1.1$ eV greatly depends on the VI/II ratio. FIG. 6 shows a relation between VI/II ratios of active layers and the estimated lifetime at room temperatures, obtained from the inclination of $E_a=1.1$ eV from the device lifetime at 80° C. It is known from FIG. 6 that a practically acceptable device lifetime can be expected by setting the VI/II ratio of the active layer to a value not smaller than 0.9 and not larger than 1.1.

The invention has been made based on the above-mentioned studies.

That is, according to the first aspect of the invention, there is provided a semiconductor light emitting device comprising:

a compound semiconductor substrate;

an n-type cladding layer on the compound semiconductor substrate;

an active layer on the n-type cladding layer;

a p-type cladding layer on the active layer:
and a p-type contact layer on the p-type cladding layer, the n-type cladding layer, active layer, p-type cladding layer and p-type contact layer being made of II–VI compound semiconductors containing at least one of group II elements selected from the group consisting of Zn, Cd, Mg, Hg and Be and at least one of group VI elements selected from the group consisting of S, Se, Te and O, characterized in that at least the active layer has undulations and at least the p-type contact layer is flat.

The active layer may have undulations in a part thereof.

In the semiconductor light emitting device according to the first aspect of the invention, the standard deviation in height of undulations of the active layer is typically 1 to 3 nm.

According to the second aspect of the invention, there is provided a method for manufacturing a semiconductor light emitting device having:

a compound semiconductor substrate;

an n-type cladding layer on the compound semiconductor substrate;

an active layer on the n-type cladding layer;
and a p-type cladding layer on the active layer, the n-type cladding layer, active layer and p-type cladding layer being made of II–VI compound semiconductors containing at least one of group II elements selected from the group consisting of Zn, Cd, Mg, Hg and Be and at least one of group VI elements selected from the group consisting of S, Se, Te and O, characterized in that the n-type cladding layer, active layer and p-type cladding layer are grown by varying, for the respective layers, the ratio of the molecular beam intensity of the group VI element relative to the molecular beam intensity of the group II element.

In the second aspect of the invention, the semiconductor light emitting device typically includes a first optical guide layer between the n-type cladding layer and the active layer and a second optical guide layer between the p-type cladding layer and the active layer. When the first and second optical guide layers are made of a II–VI compound semiconductor containing at least one of group II elements selected from the group consisting of Zn, Cd, Mg, Hg and Be and at least one of group VI elements selected from the group consisting of S, Se, Te and O, the n-type cladding layer, first optical guide layer, active layer, second optical guide layer and p-type cladding layer are grown by varying, for the respective layers, the ratio of the molecular beam intensity of the group VI element relative to the molecular beam intensity of the group II element.

Still in the second aspect of the invention, the semiconductor light emitting device typically includes a p-type contact layer on the p-type cladding layer. When the p-type contact layer is made of a II–VI compound semiconductor containing at least one of group II elements selected from the group consisting of Zn, Cd, Mg, Hg and Be and at least one of group VI elements selected from the group consisting of S, Se, Te and O, the n-type cladding layer, active layer, p-type cladding layer and p-type contact layer are grown by varying, for the respective layer, the ratio of the molecular intensity of the group VI element relative to the molecular intensity of the group II element.

In the second aspect of the invention, in order to ensure that undulations be made at least in the active layer and the p-type contact layer be flat, the active layer, at least, is grown by setting the ratio of the molecular beam intensity of the group VI element relative to the molecular intensity of the group II element to a value not lower than 0.6 and lower than 1.0, and the p-type contact layer is grown by setting the ratio of the molecular beam intensity of the group VI element relative to the molecular intensity of the group II element to a value not lower than 1.0 and not higher than 1.2.

In order to ensure undulations being made in the active layer, undulations may be made by growth in the layer immediately under the active layer so that undulations appear in the active layer even when the active layer itself is grown under normal conditions other than those for making undulations.

In the second aspect of the invention, preferably, the ratio of the molecular intensity of the group VI element relative to the molecular beam intensity of the group II element for growth of the p-type cladding layer is set to a value not less than 0.9, the ratio of the molecular intensity of the group VI element relative to the molecular beam intensity of the group II element for growth of at least the latter of the first optical guide layer and the second optical guide layer is set to a value not less than 1, and the ratio of the molecular intensity of the group VI element relative to the molecular beam intensity of the group II element for growth of the active layer is set to a value not less than 0.9 and not more than 1.1.

According to the third aspect of the invention, there is provided an optical recording and/or reproducing apparatus using a semiconductor light emitting device, in which the semiconductor light emitting device comprises:

a compound semiconductor substrate;

an n-type cladding layer on the compound semiconductor substrate;

an active layer on the n-type cladding layer;

a p-type cladding layer on the active layer:
and
a p-type contact layer on the p-type cladding layer, the n-type cladding layer, active layer, p-type cladding layer and p-type contact layer being made of II–VI compound semiconductors containing at least one of group II elements selected from the group consisting of Zn, Cd, Mg, Hg and Be and at least one of group VI elements selected from the group consisting of S, Se, Te and O, at least the active layer having undulations, and at least the p-type contact layer being flat.

In the semiconductor light emitting device having the above construction according to the first aspect of the invention, since the active layer has undulations, for example, having a height whose standard deviation is 1 to 3 nm, the lifetime of the active layer can be maximized. Additionally, since the p-type contact layer is flat, the lifetime of the p-side electrode in contact with the p-type contact layer is maximized.

In the method for manufacturing a semiconductor light emitting device having the above construction according to the second aspect of the invention, since the ratio of the molecular beam intensity of the group VI element relative to the molecular beam intensity of the group II element is varied for respective layers upon growing the n-type cladding layer, active layer and p-type cladding layer, best ratios can be selected for respective layers. As a result, it is prevented that the mode of deterioration by $E_a=0.3$ eV dominates the device deterioration, and domination by the mode of deterioration can be limited to a low temperature range, for example, not higher than the room temperature.

Moreover, undulations whose standard deviation in height is 1 to 3 nm can be made in the active layer by setting the ratio of the molecular beam intensity of the group VI element relative to the molecular beam intensity of the group II element for growth of the active layer to a value of 0.6 to 1.0, while the p-type contact layer is made flat by setting the ratio of the molecular beam intensity of the group VI element relative to the molecular beam intensity of the group II element for growth of the p-type contact layer on the p-type cladding layer to a value of 1.0 to 1.2.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Some embodiments of the invention are described below with reference to the drawings.

Figure 1:
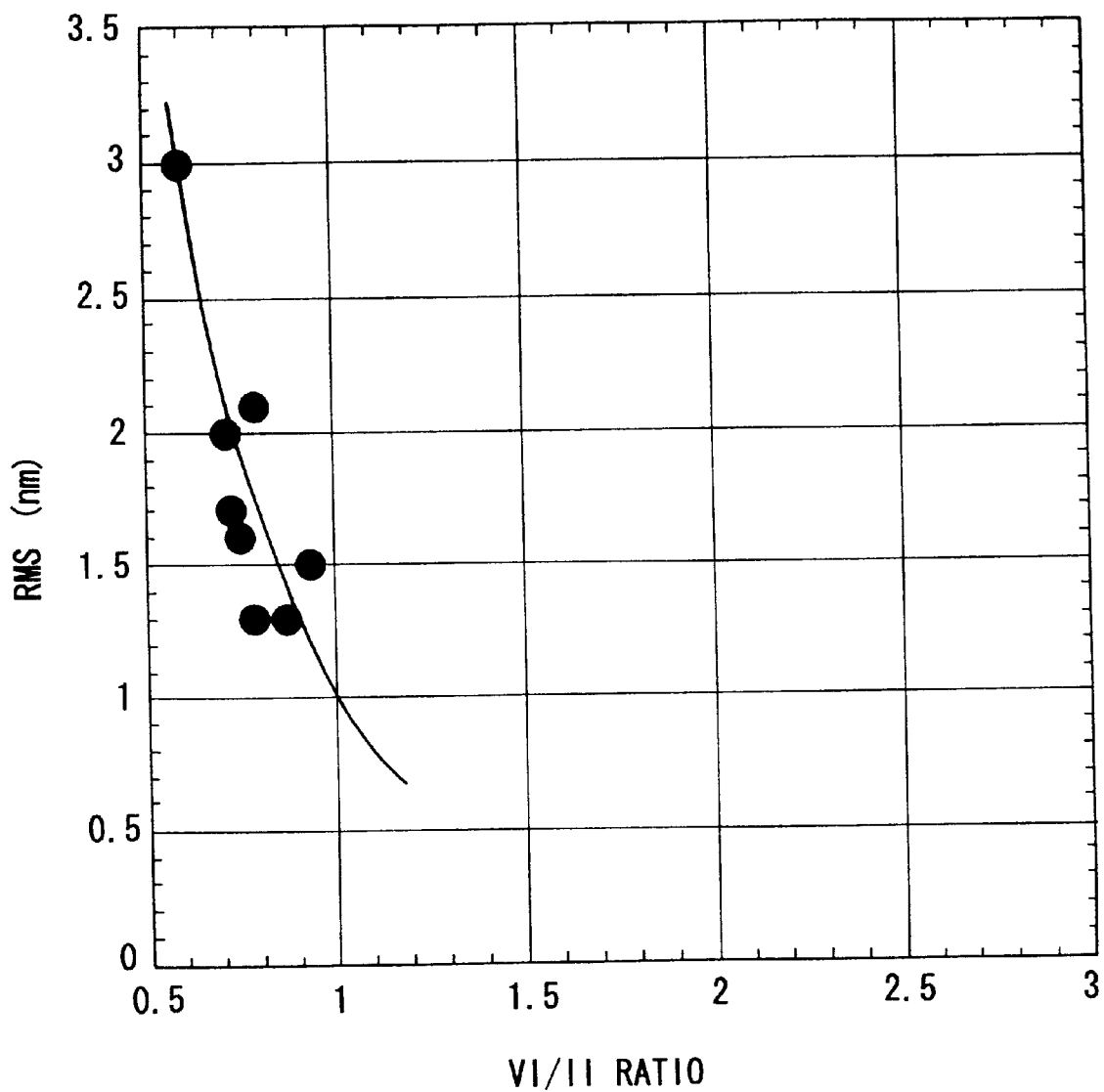
FIG. 1 is a schematic diagram showing measured values of standard deviation in height of undulations on surfaces of ZnCdMgHgBeSSeTeO layers grown by MBE, which depend upon VI/II ratios.
Figure 2:
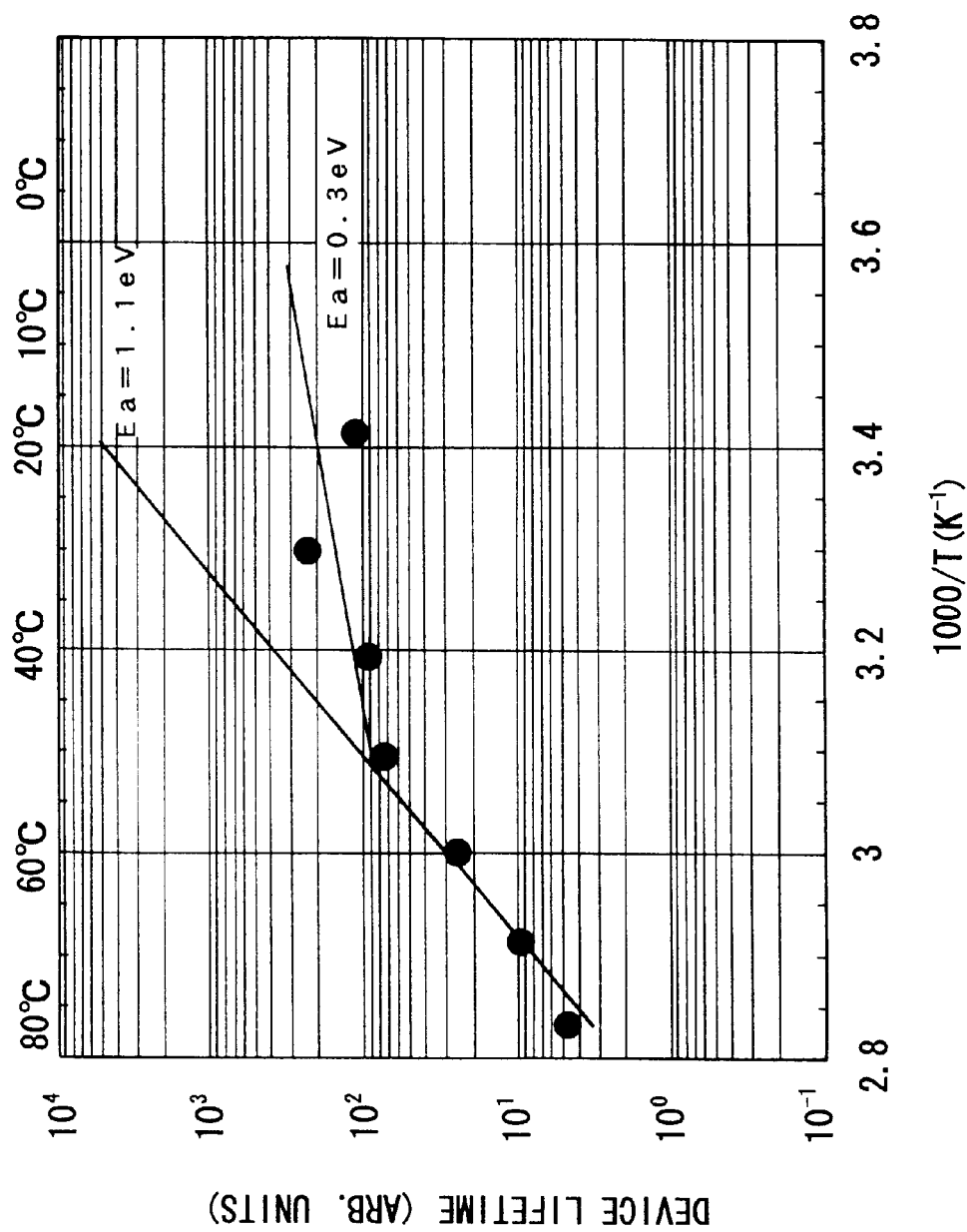
FIG. 2 is a schematic diagram showing measured lengths of lifetime of semiconductor light emitting devices using II–VI compound semiconductors prior to application of the present invention, which depend upon temperatures.
Figure 3:
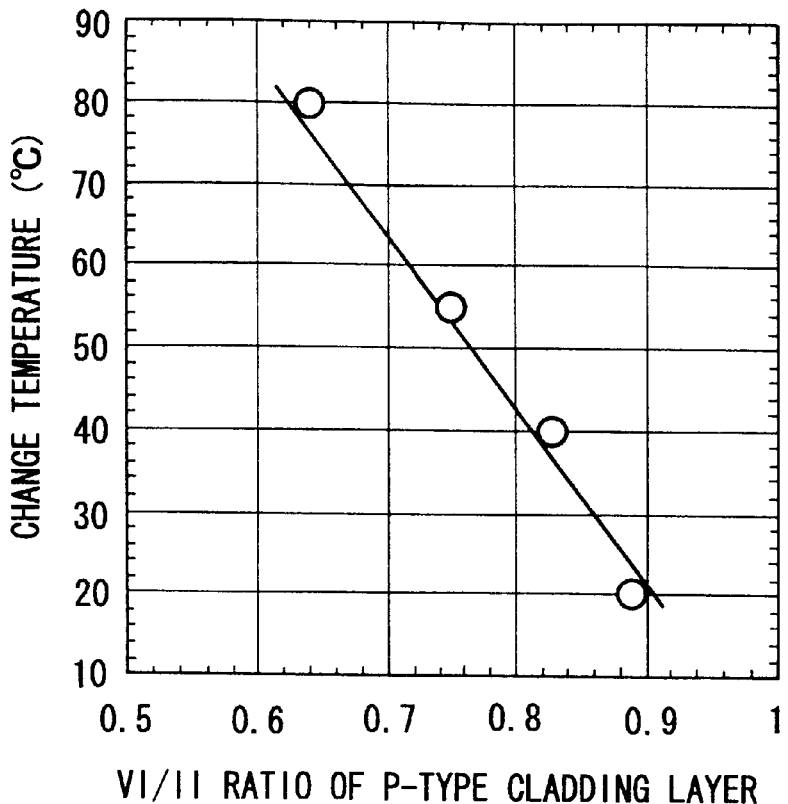
FIG. 3 is a schematic diagram showing a relation between change temperatures where the mode of deterioration by $E_a=0.3$ eV appears and VI/II ratios of p-type ZnMgSSe cladding layers.
Figure 4:
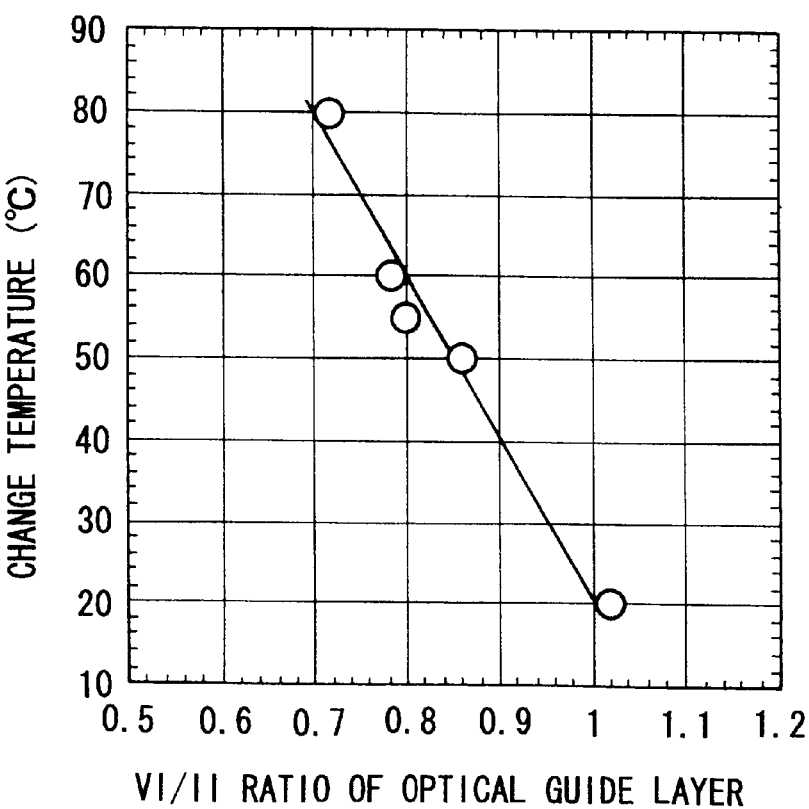
FIG. 4 is a schematic diagram showing a relation between change temperatures where the mode of deterioration by $E_a=0.3$ eV appears and VI/II ratios of p-type or n-type ZnSSe optical guide layers.
Figure 5:
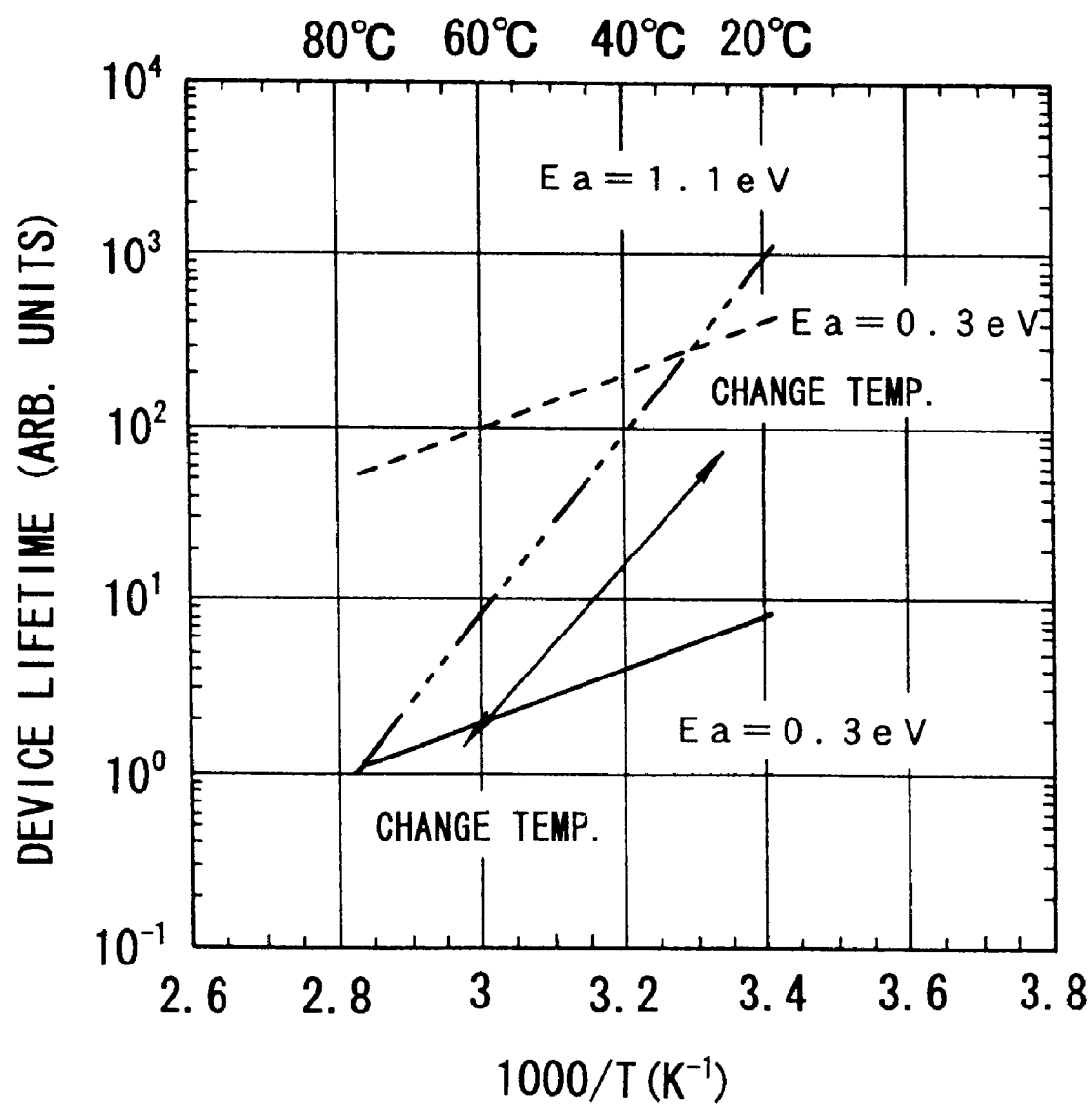
FIG. 5 is a schematic diagram showing a dependency of the device lifetime upon temperatures obtained by a high-temperature acceleration test.
Figure 6:
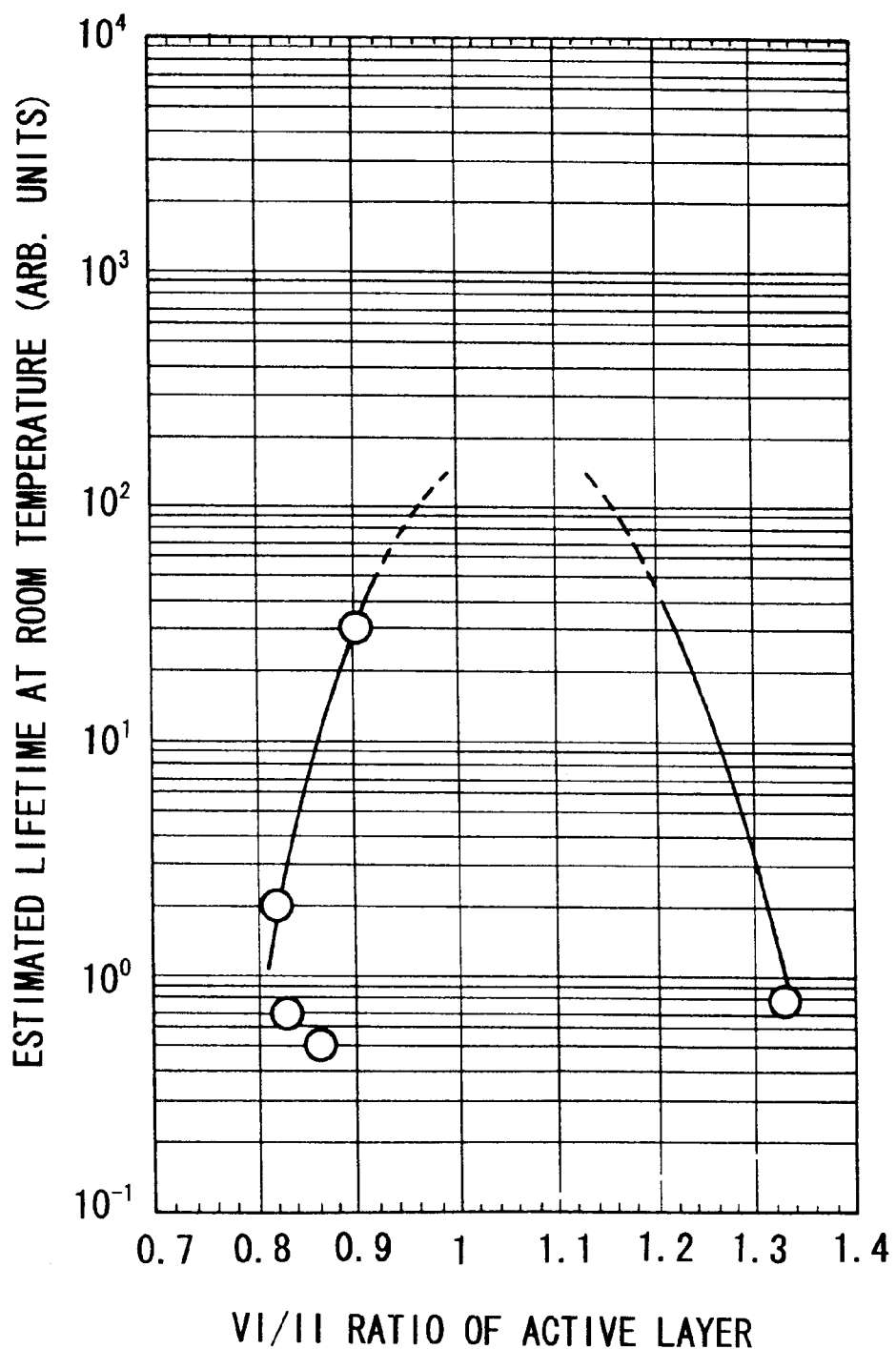
FIG. 6 is a schematic diagram showing a relation between expected lengths of device lifetime at a room temperature under the assumption that $E_a=1.1$ eV and VI/II ratios of active layers.
Figure 7:
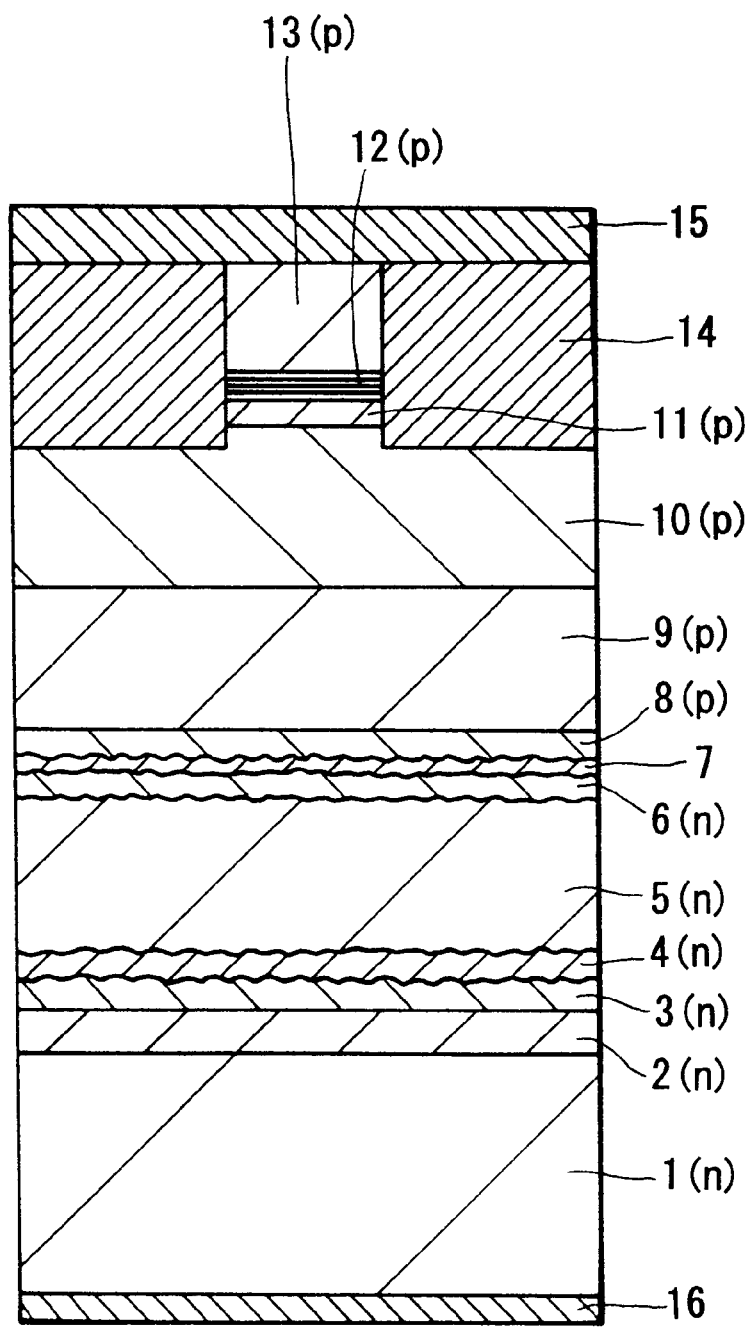
FIG. 7 is a cross-sectional view of a semiconductor laser taken as the first embodiment of the invention.

FIG. 7 shows a semiconductor laser taken as the first embodiment of the invention. The semiconductor laser has an SCH structure.

As shown in FIG. 7, in the semiconductor laser according to the first embodiment, prepared is an n-type GaAs substrate 1 doped with Si, for example, as an n-type impurity and having the (001) face orientation, for example. Sequentially grown on the substrate 1 are an n-type ZnSe buffer layer 2, n-type ZnSe buffer layer 3, n-type ZnSSe buffer layer 4, n-type ZnMgSSe cladding layer 5, n-type ZnSSe optical guide layer 6, active layer 7 of a single quantum well (SQW) structure or a multiquantum well (MQW) structure having undoped ZnCdSe layers, for example, as its quantum well layers, p-type ZnSSe optical guide layer 8, p-type ZnMgSSe cladding layer 9, p-type ZnSSe cap layer 10, p-type ZnSe contact layer 11, p-type ZnSe/ZnTe MQW layer 12, and p-type ZnTe contact layer 13.

The n-type GaAs buffer layer 2 is 0.5 μm thick, for example, and doped with Si, for example, as an n-type impurity. The n-type ZnSe buffer layer 3 is 30 nm thick, for example, and doped with Cl, for example, as an n-type impurity. The n-type ZnSSe buffer layer 4 is 50 nm thick, for example, and doped with Cl, for example, as an n-type impurity. The n-type ZnMgSSe cladding layer 5 is 0.8 μm thick, for example, and doped with Cl, for example, as an n-type impurity. The n-type ZnSSe optical guide layer 6 is 45 nm thick, for example, and doped with Cl, for example, as an n-type impurity. The p-type ZnSSe optical guide layer 8 is 45 nm thick, for example, and doped with N, for example, as a p-type impurity. The p-type ZnMgSSe cladding layer 9 is 1 μm thick, for example, and doped with N, for example, as a p-type impurity. The p-type ZnSSe cap layer 10 is 400 nm thick, for example, and doped with N, for example, as a p-type impurity. The p-type ZnSe contact layer 11 is 200 nm thick, for example, and doped with N, for example, as a p-type impurity. The p-type ZnSe layers and p-type ZnTe layers forming the p-type ZnSe/ZnTe MQW layer 12 are doped with N, for example, as a p-type impurity. The p-type ZnTe contact layer 13 is 100 nm thick, for example, and doped with N, for example, as a p-type impurity.

An upper-lying portion of the p-type ZnSSe cap layer 10, p-type ZnSe contact layer 11, p-type ZnSe/ZnTe MQW layer 12 and p-type ZnTe contact layer 13 have the form of a stripe extending in one direction (for example, <1–10> direction).

An insulating layer 14, which may be an $Al_2O_3$ layer, is formed on the area of the p-type ZnSSe cap layer 10 excluding the stripe portion, so as to form a current blocking structure. The insulating layer 14 may be made of polyimide, for example.

Formed on the insulating layer 14 and the p-type ZnTe contact layer 13 is a p-side electrode 15 of a Pd/Pt/Au structure, for example, in ohmic contact with the p-type ZnTe contact layer 13. On the bottom surface of the n-type GaAs substrate 1, an n-side electrode 16, such as In electrode, is formed in ohmic contact.

In the semiconductor laser according to the embodiment, the n-type ZnSe buffer layer 3, n-type ZnSSe buffer layer 4, n-type ZnMgSSe cladding layer 5, n-type ZnSSe optical guide layer 6 and active layer 7 include undulations extending substantially in parallel. The standard deviation (RMS) in height of the undulations in these layers is 1 to 3 nm. The extending direction of these undulations is <1–10>, and their wavelength direction is <1–10>.

In contrast, all of the p-type ZnSSe optical guide layer 8, p-type ZnMgSSe cladding layer 9, p-type ZnSSe cap layer 10, p-type ZnSe contact layer 11, p-type ZnSe/ZnTe MQW layer 12 and p-type ZnTe contact layer 13, or at least the p-type ZnSe contact layer 11, p-type ZnSe/ZnTe MQW layer 12 and p-type ZnTe contact layer 13, are flat.

Next explained is a method for manufacturing the semiconductor laser according to the first embodiment of the invention.

For manufacturing the semiconductor laser, the n-type GaAs substrate 1 is set on a substrate holder in a highly evacuated vacuum container of a MBE apparatus, not shown, for growth of III–V compound semiconductors.

Then, the n-type GaAs substrate 1 is heated to a predetermined growth temperature, 560° C., for example, and the n-type GaAs buffer layer 2 is grown on the n-type GaAs substrate 1 by MBE. In this case, Si molecular beam sources (Knudsen cells) are used for doping Si as n-type impurity. Prior to the growth of the n-type GaAs buffer layer 2, the surface of the n-type GaAs substrate 1 may be cleaned by heating the substrate to a temperature around 580° C., for example, to remove a surface oxide film, or the like, from its surface by thermal etching.

Figure 8:
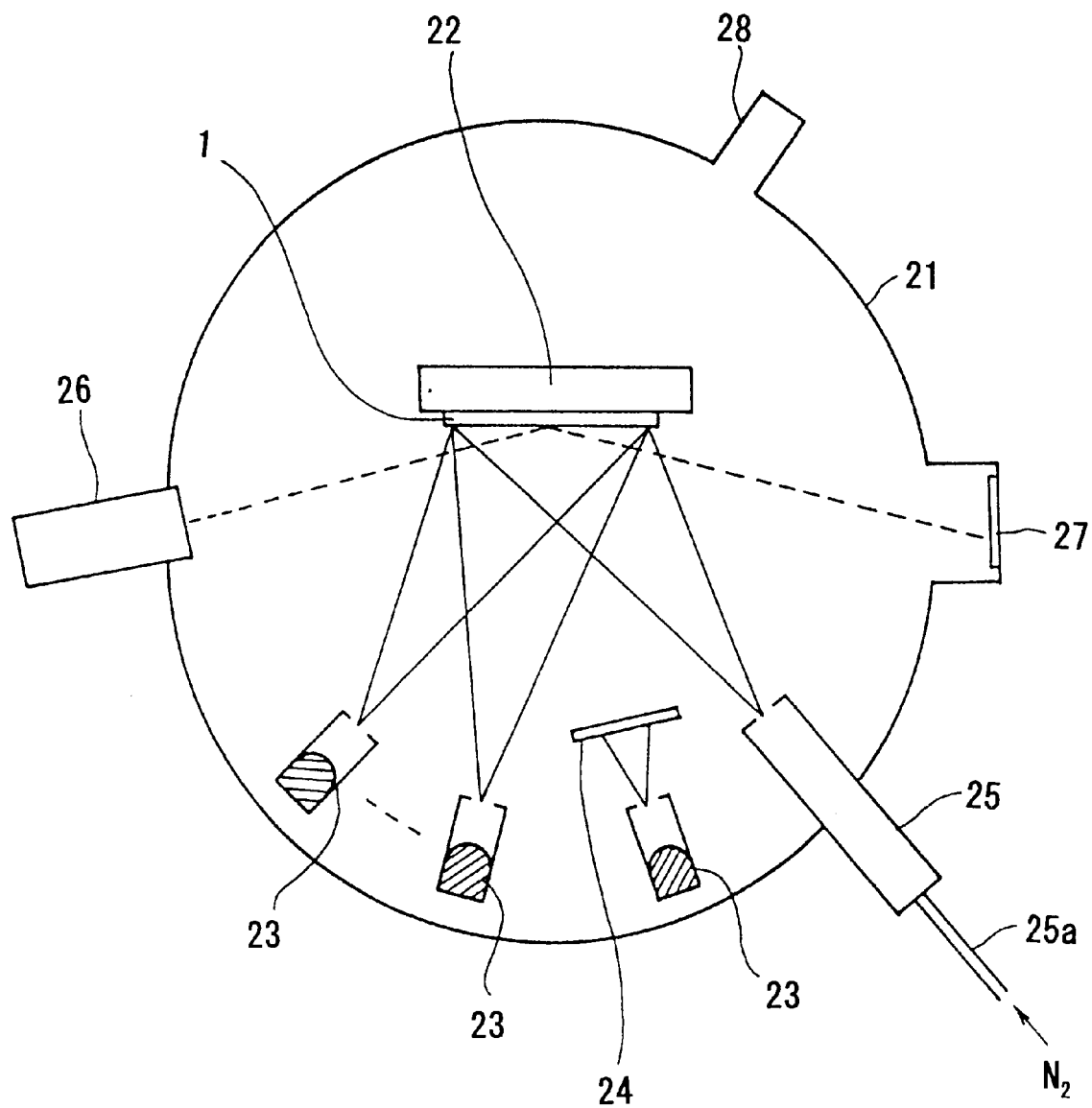
FIG. 8 is a schematic diagram showing a MBE apparatus used for growth of II–VI compound semiconductor layers in the first embodiment of the invention.

After that, the n-type GaAs substrate having the n-type GaAs buffer layer 2 thereon is moved from the MBE apparatus for growth of III–V compound semiconductors through a vacuum transport path (not shown) into a MBE apparatus for growth of II–VI compound semiconductors shown in FIG. 8. In the MBE apparatus shown in FIG. 8, respective II–VI compound semiconductors forming the laser structure are grown. In this case, the surface of the n-type GaAs buffer layer 2 remains clean without being exposed to ambient air while moved to the MBE apparatus.

As shown in FIG. 8, in the MBE apparatus, a substrate holder 22 is provided in a vacuum container 21 highly evacuated by a super-high evacuator (not shown), and the substrate for growth of layers thereon is put on the substrate holder 22. The vacuum container 21 also contains a plurality of molecular beam sources (Knudsen cells) 23 supported in confrontation with the substrate holder 22. In this case, the molecular beam sources 23 used here are sources of Zn, Se, Mg, ZnS, Cd, Te, $ZnCl_2$, and so forth. These molecular beam sources 23 are valve cells in which valves can be opened and closed to control intensities of molecular beams generated from the molecular beam sources 23. An openable shutter 24 is provided at the front of each molecular beam source 23. The vacuum container 21 also contains a plasma cell 25 using electron cyclotron resonance (ECR) or radio frequency (RF) oriented toward the substrate holder 22. The vacuum container 21 further contains a reflection high energy electron diffraction (RHEED) electron gun 26 and a fluorescent screen 27 so that a RHEED image can be observed. Also contained in the vacuum container 21 is a quadrupole mass analyzer 28.

For growing II–VI compound semiconductor layers forming the laser structure on the n-type GaAs buffer layer 2, the n-type GaAs substrate 1 having the n-type GaAs buffer layer 2 grown thereon is set on the substrate holder 22 in the vacuum container 21 of the MBE apparatus shown in FIG. 8. Then, the growth by MBE is started, keeping the n-type GaAs substrate n-type GaAs substrate 1 at a predetermined growth temperature, approximately, 250° C., for example. That is, sequentially grown on the n-type GaAs buffer layer 2 are the n-type ZnSe buffer layer 3, n-type ZnSSe buffer layer 4, n-type ZnMgSSe cladding layer 5, n-type ZnSSe optical guide layer 6, active layer 7, p-type ZnSSe optical guide layer 8, p-type ZnMgSSe cladding layer 9, p-type ZnSSe cap layer 10, p-type ZnSe contact layer 11, p-type ZnSe/ZnTe MQW layer 12, and p-type ZnTe contact layer 13.

In this case, until the growth of the n-type ZnSe buffer layer 3, n-type ZnSSe buffer layer 4, n-type ZnMgSSe cladding layer 5, n-type ZnSSe optical guide layer 6 and active layer 7 is completed, the VI/II ratio of molecular beams used for the growth is set and maintained at a value not less than 0.6 and less than 1.0, namely, 0.8, for example. For the later growth of the p-type ZnSSe optical guide layer 8, p-type ZnMgSSe cladding layer 9, p-type ZnSSe cap layer 10, p-type ZnSe contact layer 11, p-type ZnSe/ZnTe MQW layer 12, and p-type ZnTe contact layer 13, the VI/II ratio of molecular beams used for the growth is set to a value not less than 1.0 and not larger than 1.2, namely, 1.1, for example. In this manner, undulations are made in the n-type ZnSe buffer layer 3, n-type ZnSSe buffer layer 4, n-type ZnMgSSe cladding layer 5, n-type ZnSSe optical guide layer 6 and active layer 7 whilst the p-type ZnSSe optical guide layer 8, p-type ZnMgSSe cladding layer 9, p-type ZnSSe cap layer 10, p-type ZnSe contact layer 11, p-type ZnSe/ZnTe MQW layer 12, and p-type ZnTe contact layer 13 are made flat.

Control of the VI/II ratio during growth of these II–VI compound semiconductor layers is made by controlling the molecular beam intensities by opening and closing valves of valve cells used as the molecular beam sources 23.

For doping Cl as the n-type impurity of the n-type ZnSe buffer layer 3, n-type ZnSSe buffer layer 4, n-type ZnMgSSe cladding layer 5 and n-type ZnSSe optical guide layer, ZnCl$_2$, for example, is used as the dopant. For doping N as the p-type impurity into the p-type ZnSSe optical guide layer 8, p-type ZnMgSSe cladding layer 9, p-type ZnSSe cap layer 10, p-type ZnSe contact layer 11, p-type ZnSe/ZnTe MQW layer 12 and p-type ZnTe contact layer 13, N$_2$ gas introduced through a nitrogen gas inlet tube 25a is changed into plasma in the plasma cell 25 of the MBE apparatus shown in FIG. 8, and the N$_2$ plasma is irradiated onto the substrate surface.

After that, a stripe-shaped resist pattern (not shown) is applied onto the p-type ZnTe contact layer 13 by lithography, and the product is etched by wet etching, for example, using the resist pattern as a mask, to the depth reaching a middle portion of the p-type ZnSSe cap layer 10 in its thickness direction. As a result, the upper-lying portion of the p-type ZnSSe cap layer 10, p-type ZnSe contact lawyer 11, p-type ZnS/ZnTe MQW layer 12 and p-type ZnTe contact layer 13 are patterned into a stripe extending in the <110> direction.

After that, maintaining the resist pattern used for the etching, the Al$_2$O$_3$ film is formed on the entire surface of the product by vacuum evaporation, or the like. Then, the resist pattern is removed together with the overlying portion of the Al$_2$O$_3$ film (lift off). As a result, the insulating layer 14 is formed at both sides of the stripe-patterned upper portion of the p-type ZnSSe cap layer 10, p-type ZnSe contact layer 11, p-type ZnSe/ZnTe MQW layer 12 and p-type ZnTe contact layer 13.

After that, the p-side electrode 15 of a Pd/Pt/Au structure is made by sequentially depositing a Pd film, Pt film and Au film on the entire surface of the stripe-shaped p-type ZnTe contact layer 13 and the insulating layer 14 at opposite sides of the contact layer 14 by vacuum evaporation, for example. If necessary, annealing follows to bring the p-side electrode 15 into ohmic contact with the p-type ZnTe contact layer 13. Formed on the bottom surface of the n-type GaAs substrate 1 is the n-side electrode 16 such as In electrode.

After that, the n-type GaAs substrate 1 having the laser structure thereon is cloven into bars to expose opposite cavity end surfaces, and, after applying an end coating, if necessary, the bars are cloven into chips. The laser chip, thus, obtained, is mounted on a heat sink for packaging. As a result, the intended semiconductor laser is obtained.

Figure 9:
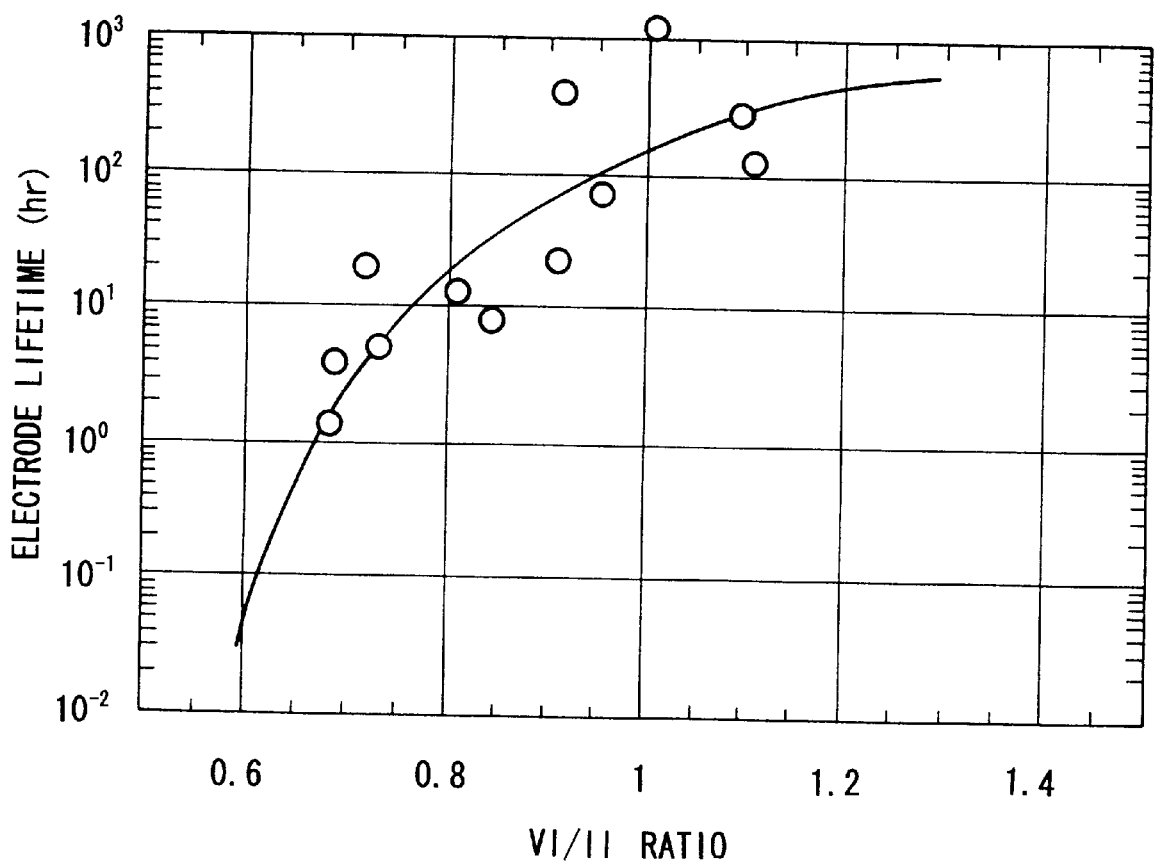
FIG. 9 is a schematic diagram showing measured lengths of lifetime of a p-side electrode in the semiconductor laser, which depends upon VI/II ratios, according to the first embodiment of the invention.

FIG. 9 shows results of measurement of changes in lifetime of the p-side electrode 15 with the VI/II ratio upon growing layers forming the semiconductor laser by MBE. It is known from FIG. 9 that the lifetime of the p-side electrode 15 is maximized to approximately 1000 hours when the VI/II ratio is around 1.1.

On the other hand, according to results of another measurement of the lifetime of the active layer 7, the lifetime of the active layer 7 is maximized when the VI/II ratio is around 0.8.

As shown above, according to the first embodiment, when at least the active layer 7 has undulations whose RMS in height is 1 to 3 nm, for example, the lifetime of the active layer 7 is maximized. Additionally, when the p-type ZnSe contact layer 11 in contact with the p-side electrode 15, p-type ZnSe/ZnTe MQW layer 12 and p-type ZnTe contact layer 13 are made flat, the lifetime of the p-side electrode 15 is maximized. As a result, the lifetime of the semiconductor light emitting device can be elongated remarkably, and its characteristics and reliability can be improved.

Figure 10:
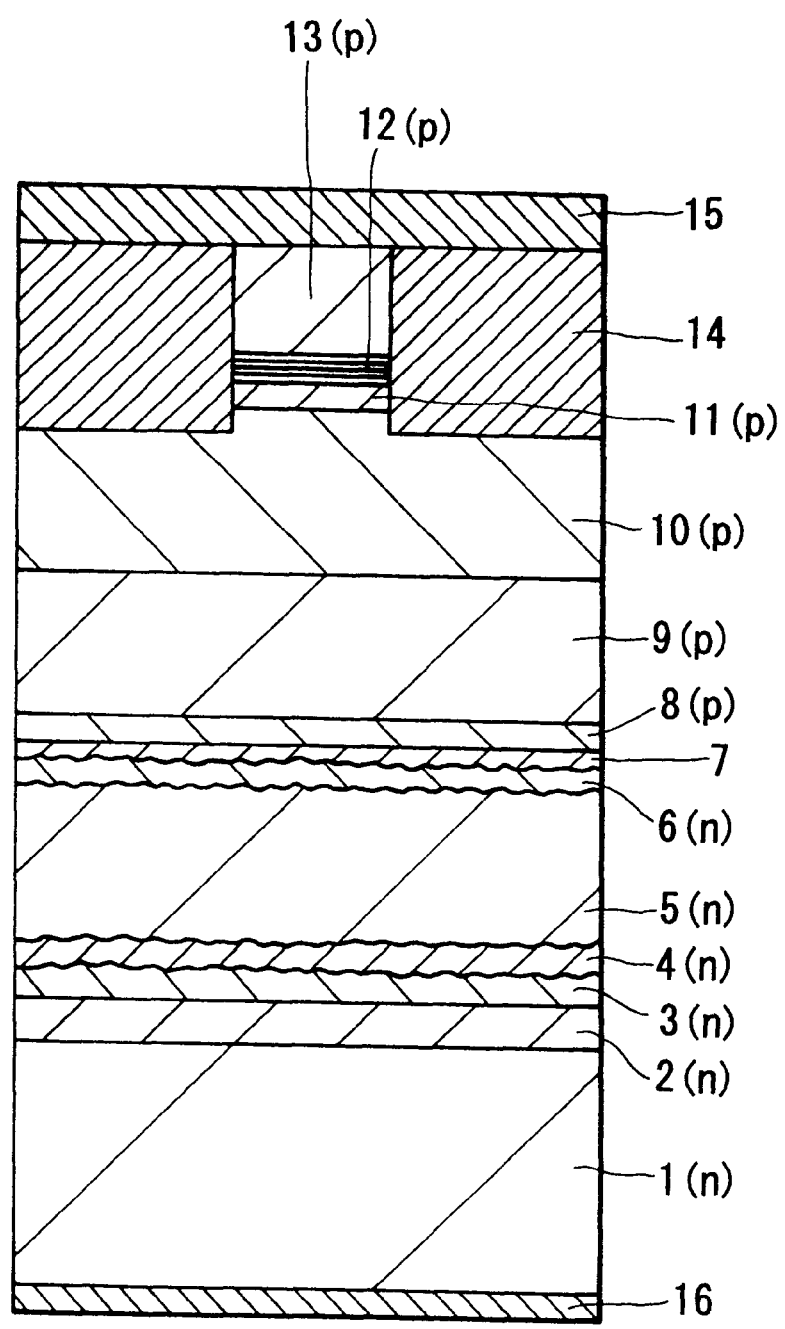
FIG. 10 is a cross-sectional view of a semiconductor laser taken as the second embodiment of the invention.

FIG. 10 shows a semiconductor laser taken as the second embodiment of the invention.

As shown in FIG. 10, in the semiconductor laser according to the second embodiment, the n-type ZnSe buffer layer 3, n-type ZnSSe buffer layer 4, n-type ZnMgSSe cladding layer 5 and n-type ZnSSe optical guide layer 6 include undulations extending substantially in parallel. The standard deviation (RMS) in height of the undulations in these layers is 1 to 3 nm. The extending direction of these undulations is <1–10>, and their wavelength direction is <110>. In contrast, all of the active layer, p-type ZnSSe optical guide layer 8, p-type ZnMgSSe cladding layer 9, p-type ZnSSe cap layer 10, p-type ZnSe contact layer 11, p-type ZnSe/ZnTe MQW layer 12 and p-type ZnTe contact layer 13, or at least the p-type ZnSe contact layer 11, p-type ZnSe/ZnTe MQW layer 12 and p-type ZnTe contact layer 13, are flat. In the other respects, the semiconductor laser is the same as that of the first embodiment, and explanation thereof is omitted here.

Next explained is a method for manufacturing the semiconductor laser according to the second embodiment of the invention.

In the first step of the semiconductor laser manufacturing method according to the second embodiment, the n-type GaAs buffer layer 2 is grown on the n-type GaAs substrate 1 in the same manner as the first embodiment.

Next grown on the n-type GaAs buffer layer 2 in the MBE apparatus shown in FIG. 8 are, in sequence, the n-type ZnSe buffer layer 3, n-type ZnSSe buffer layer 4, n-type ZnMgSSe cladding layer 5, n-type ZnSSe optical guide layer 6, active layer 7, p-type ZnSSe optical guide layer 8, p-type ZnMgSSe cladding layer 9, p-type ZnSSe cap layer 10, p-type ZnSe contact layer 11, p-type ZnSe/ZnTe MQW layer 12, and p-type ZnTe contact layer 13.

In order to minimize stacking fault starting from the interface between the n-type ZnSe buffer layer 3 and the n-type GaAs buffer layer 2 during growth of the n-type ZnSe buffer layer 3, molecular beams are irradiated onto the As (2×4) surface plane of the n-type GaAs buffer layer 2 prior to the growth of the n-type ZnSe buffer layer 3, and MEE (Migration Enhanced Epitaxy) growth is done in the initial stage of growth of the n-type ZnSe buffer layer 3. In this manner, the device lifetime is not shortened by the mode of deterioration by $E_a$=0.3 eV.

In this case, during growth of the n-type ZnSe buffer layer 3 and the n-type ZnSSe buffer layer 4, the VI/II ratio of molecular beams used for the growth is set and maintained at approximately 0.95. During growth of the n-type ZnMgSSe cladding layer 5, the VI/II ratio of molecular beams used for the growth is set and maintained at approximately 0.9. By making undulations in the n-type ZnMgSSe cladding layer 5 under the above condition of VI/II ratio, the rate of deterioration of the active layer 7 can be made low. Since the height of the undulations is several times a nanometer, it is sufficient for the undulated layer to be 100 nm or more. During growth of the n-type ZnSSe optical guide layer 6, the VI/II ratio of molecular beams used for the growth is set and maintained at approximately 0.95. During growth of the active layer 7, the VI/II ratio of molecular beams used for the growth is set and maintained at approximately 1.05. This value results in suppressing deterioration of the active layer 7 itself and in improving the device lifetime. During growth of the p-type ZnSSe optical guide layer 8 and the p-type ZnMgSSe cladding layer 9, the VI/II ratio of molecular beams used for the growth is set and maintained at approximately 1.05. This value contributes to suppressing the mode of deterioration by $E_a$=0.3 eV and to overcoming the limit of the device lifetime. During growth of the p-type ZnSSe cap layer 10, p-type ZnSe contact layer 11, p-type ZnSe/ZnTe MQW layer 12, and p-type ZnTe contact layer 13, the VI/II ratio of molecular beams used for the growth is set to approximately 1.1. Thus, undulations are alleviated, and the p-type ZnSSe cap layer 10, p-type ZnSe contact layer 11, p-type ZnSe/ZnTe MQW layer 12, and p-type ZnTe contact layer 13 are made flat. As a result, the lifetime of the p-side electrode 15 is improved. Selection of these VI/II ratios can be attained by opening and closing the valve of the molecular beam source 23 of Se, for example, to adjust the molecular beam intensity of Se.

After that, by progressing the step of making the stripe portion and subsequent steps in the same manner as the first embodiment, the intended semiconductor laser is obtained.

As explained above, according to the second embodiment, by determining appropriate VI/II ratios for respective II–VI compound semiconductor lasers forming the semiconductor laser, both two modes of deterioration, namely, the mode of deterioration by $E_a=0.3$ eV and that by $E_a=1.1$ eV can be suppressed. As a result, the lifetime of the semiconductor laser can be elongated remarkably, and its characteristics and reliability can be improved.

Figure 11:
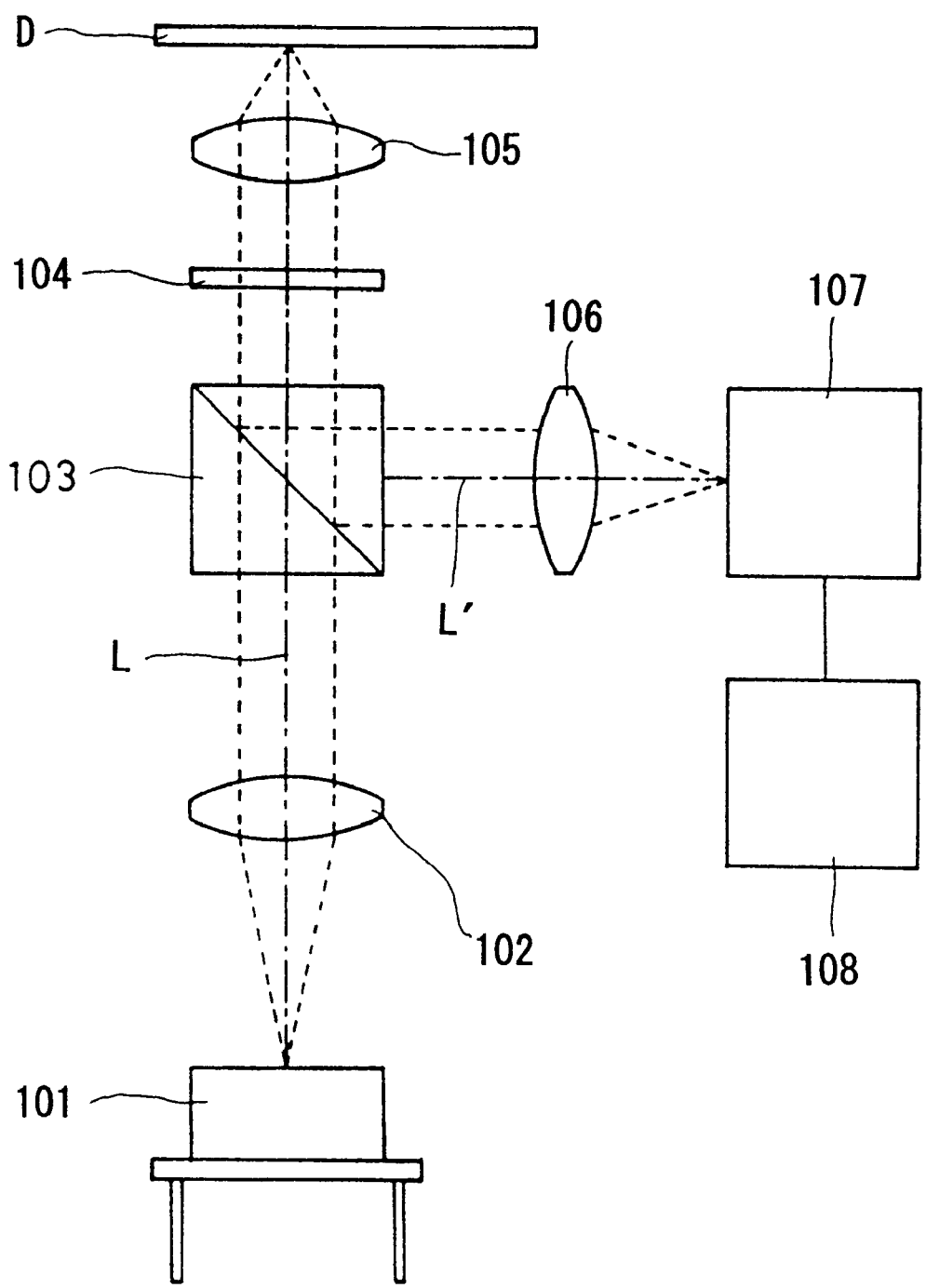
FIG. 11 is a schematic diagram showing an optical disk reproducing apparatus using as its light emitting device the semiconductor laser according to the first or second embodiment of the invention.

Next explained is an optical disc reproducing apparatus using as its light emitting device the semiconductor laser for emitting blue to green light according to the first or second embodiment. FIG. 11 shows a construction of the optical disc reproducing apparatus.

As shown in FIG. 11, the optical disc reproducing device includes a semiconductor laser 101 as its light emitting device. The semiconductor 101 used here is one explained with the first or second embodiment. The optical disc reproducing apparatus further includes a known optical system for introducing light from the semiconductor laser 101 to an optical disc D and for reproducing light reflected from the optical disc (signal light), namely, collimator lens 102, beam splitter 103, ¼ wavelength plate 104, object lens 105, detector lens 106, signal light detecting element 107, and signal light reproducing circuit 108.

In the optical disc reproducing apparatus, output light L from the semiconductor laser 101 is shaped into parallel beams of light by the choriomata lens 102, passing through the beam splitter 103, adjusted in polarization by the ¼ wavelength plate 104, and focused onto the optical disc D by the object lens 105. The signal light L' reflected back from the optical disc D, after passing through the object lens 105 and the ¼ wavelength plate 104, is reflected by the beam splitter 103. The, it passes through the detector lens 106 and enters into the signal light detecting device 107. There, it is converted into an electric signal, and the signal light reproducing circuit 108 reproduces from the electric signal the information recorded on the optical disc D.

Since this optical disc reproducing apparatus uses the long-lifetime semiconductor laser according to the first or second embodiment as its semiconductor laser, also the optical disc reproducing apparatus can be elongated in lifetime.

Although the above explanation has been made as applying the semiconductor laser according to the first or second embodiment to a light emitting device of an optical disc reproducing apparatus, it is applicable to a light emitting device of any other optical apparatus, such as optical disc record/reproducing apparatus, optical transmission apparatus, and so forth, and also to a light emitting device of car-borne device operated in a high temperature condition, video display, or the like.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the first embodiment has been described as setting and maintaining the VI/II ratio of molecular beams in the range not less than 0.6 and less than 1.0 until completing the growth of the n-type ZnSe buffer layer 3, n-type ZnSSe buffer layer 4, n-type ZnMgSSe cladding layer 5, n-type ZnSSe optical guide layer 6 and active layer 7, and as setting and maintaining the VI/II ratio of molecular beams in the range not lower than 1.0 and lower than 1.2 during the later growth of the p-type ZnSSe optical guide layer 8, p-type ZnMgSSe cladding layer 9, p-type ZnSSe cap layer 10, p-type ZnSe contact layer 11, p-type ZnSe/ZnTe MQW layer 12 and p-type ZnTe contact layer 13. However, it is possible to use a VI/II ratio in the range not lower than 0.6 and lower than 1.0 for growth of layers from the n-type ZnSe buffer layer 3 to the lower half of the p-type ZnSSe cap layer 10, and use a VI/II ration in the range not lower than 1.0 and not higher than 1.2 for subsequent growth of the remainder half of the p-type ZnSSe cap layer 10, p-type ZnSe contact layer 11, p-type ZnSe/ZnTe MQW layer 12 and p-type ZnTe contact layer 13.

Subject to undulations being made in the active layer 7, the n-type ZnSe buffer layer 3, n-type ZnSSe buffer layer 4 and n-type ZnMgSSe cladding layer 5 alone may be grown under undulation-making conditions, and all the other upper layers may be grown under flat-making conditions. Alternatively, subject to undulations being made in the active layer 7, the n-type ZnSSe optical guide layer 6 alone may be grown under undulation-making conditions, and all the other layers may be grown under flat-making conditions.

Although the MBE apparatus used in the first embodiment for growth of II–VI compound semiconductors uses valve cells as molecular beam sources 23 to determine VI/II ratios by controlling molecular beam intensities by opening and closing the valves, VI/II ratios may be controlled by using a plurality of molecular beam sources 23 of Se or Zn, for example, to use an appropriate number of these molecular beam sources 23 during growth of respective II–VI compound semiconductor layers.

Moreover, although the first and second embodiments have been described as applying the invention to a semiconductor laser having an SCH structure, the invention is also applicable to a semiconductor laser having a DH structure (Double Heterostructure). Further, although the embodiments have been described as allying the invention to a semiconductor laser, the invention is also applicable to a light emitting diode.

As described above, since the semiconductor light emitting device according to the invention includes undulations at least in its active layer whilst the p-type contact layer is flat, it realizes excellent characteristics, a high reliability and a long lifetime.

Further, since the method for manufacturing a semiconductor light emitting device according to the invention uses appropriate values of the ratio of the group VI element molecular beam intensity relative to the group II element molecular beam intensity, respectively, for growth of the n-type cladding layer, active layer and p-type cladding layer, a semiconductor light emitting device having excellent characteristics, a high reliability and a long lifetime can be obtained.

The optical recording and/or reproducing apparatus according to the invention, can be elongated in its own lifetime by using a long-lifetime semiconductor light emitting device according to the invention.

What is claimed is:

1. A semiconductor light emitting device comprising:
   a compound semiconductor substrate;
   an n-type cladding layer on said compound semiconductor substrate;
   an active layer on said n-type cladding layer;
   a p-type cladding layer on said active layer: and
   a p-type contact layer on said p-type cladding layer,
   said n-type cladding layer, said active layer, said p-type cladding layer and said p-type contact layer being made of II–VI compound semiconductors containing at least one of group II elements selected from the group consisting of Zn, Cd, Mg, Hg and Be and at least one of group VI elements selected from the group consisting of S, Se, Te and O,
   characterized in that at least said active layer has undulations and at least said p-type contact layer is flat.

2. The semiconductor light emitting device according to claim 1 wherein the standard deviation in height of said undulations of said active layer is 1 to 3 nm.

3. A method for manufacturing a semiconductor light emitting device having:
   a compound semiconductor substrate;
   an n-type cladding layer on said compound semiconductor substrate;
   an active layer on said n-type cladding layer; and
   a p-type cladding layer on said active layer,
   said n-type cladding layer, said active layer and said p-type cladding layer being made of II–VI compound semiconductors containing at least one of group II elements selected from the group consisting of Zn, Cd, Mg, Hg and Be and at least one of group VI elements selected from the group consisting of S, Se, Te and O,
   characterized in that said n-type cladding layer, said active layer and said p-type cladding layer are grown by varying, for the respective layers, the ratio of the molecular beam intensity of the group VI element relative to the molecular beam intensity of the group II element.

4. The method for manufacturing a semiconductor light emitting device according to claim 3 wherein said semiconductor light emitting device includes a first optical guide layer between the n-type cladding layer and said active layer and a second optical guide layer between said p-type cladding layer and said active layer, said first and second optical guide layers being made of a II–VI compound semiconductor containing at least one of group II elements selected from the group consisting of Zn, Cd, Mg, Hg and Be and at least one of group VI elements selected from the group consisting of S, Se, Te and O, and said n-type cladding layer, said first optical guide layer, said active layer, said second optical guide layer and said p-type cladding layer being grown by varying, for the respective layers, the ratio of the molecular beam intensity of the group VI element relative to the molecular beam intensity of the group II element.

5. The methlightr manufacturing a semiconductor light emitting device according to claim 3 wherein said semiconductor light emitting device includes a p-type contact layer on said p-type cladding layer, said p-type contact layer being made of a II–VI compound semiconductor containing at least one of group II elements selected from the group consisting of Zn, Cd, Mg, Hg and Be and at least one of group VI elements selected from the group consisting of S, Se, Te and O, and said n-type cladding layer, said active layer, said p-type cladding layer and said p-type contact layer being grown by varying, for the respective layer, the ratio of the molecular intensity of the group VI element relative to the molecular intensity of the group II element.

6. The method for manufacturing a semiconductor light emitting device according to claim 3 wherein at least said active layer is grown by setting the ratio of the molecular beam intensity of the group VI element relative to the molecular intensity of the group II element to a value not lower than 0.6 and lower than 1.0, and at least said p-type contact layer is grown by setting the ratio of the molecular beam intensity of the group VI element relative to the molecular intensity of the group II element to a value not lower than 1.0 and not higher than 1.2.

7. The method for manufacturing a semiconductor light emitting device according to claim 3 wherein the ratio of the molecular intensity of the group VI element relative to the molecular beam intensity of the group II element for growth of said p-type cladding layer is set to a value not less than 0.9.

8. The method for manufacturing a semiconductor light emitting device according to claim 3 wherein the ratio of the molecular intensity of the group VI element relative to the molecular beam intensity of said second optical guide layer is set to a value not less than 1.

9. The method for manufacturing a semiconductor light emitting device according to claim 3 wherein the ratio of the molecular intensity of the group VI element relative to the molecular beam intensity of the group II element for growth of said active layer is set to a value not less than 0.9 and not more than 1.1.

10. The method for manufacturing a semiconductor light emitting device according to claim 3 wherein the ratio of the molecular intensity of the group VI element relative to the molecular beam intensity of the group II element for growth of said p-type cladding layer is set to a value not less than 0.9, and the ratio of the molecular intensity of the group VI element relative to the molecular beam intensity of the group II element for growth of said second optical guide layer is set to a value not less than 1.

11. The method for manufacturing a semiconductor light emitting device according to claim 3 wherein the ratio of the molecular intensity of the group VI element relative to the molecular beam intensity of the group II element for growth of said p-type cladding layer is set to a value not less than 0.9, and the ratio of the molecular intensity of the group VI element relative to the molecular beam intensity of the group II element for growth of said active layer is set to a value not less than 0.9 and not more than 1.1.

12. The method for manufacturing a semiconductor light emitting device according to claim 3 wherein the ratio of the molecular intensity of the group VI element relative to the molecular beam intensity of the group II element for growth of at least the latter of said first optical guide layer and said second optical guide layer is set to a value not less than 1, and the ratio of the molecular intensity of the group VI element relative to the molecular beam intensity of the group II element for growth of said active layer is set to a value not less than 0.9 and not more than 1.1.

13. The method for manufacturing a semiconductor light emitting device according to claim 3 wherein the ratio of the molecular intensity of the group VI element relative to the molecular beam intensity of the group II element for growth of said p-type cladding layer is set to a value not less than 0.9, the ratio of the molecular intensity of the group VI element relative to the molecular beam intensity of the group II element for growth of said second optical guide layer is set to a value not less than 1, and the ratio of the molecular intensity of the group VI element relative to the molecular beam intensity of the group II element for growth of said active layer is set to a value not less than 0.9 and not more than 1.1.

14. An optical recording and/or reproducing apparatus using a semiconductor light emitting device, said light emitting device comprising:

a compound semiconductor substrate;

an n-type cladding layer on said compound semiconductor substrate;

an active layer on said n-type cladding layer;

a p-type cladding layer on said active layer: and a p-type contact layer on said p-type cladding layer, said n-type cladding layer, said active layer, said p-type cladding layer and said p-type contact layer being made of II–VI compound semiconductors containing at least one of group II elements selected from the group consisting of Zn, Cd, Mg, Hg and Be and at least one of group VI elements selected from the group consisting of S, Se, Te and O, at least said active layer having undulations, and at least said p-type contact layer being flat.

* * * * *